United States Patent
Di Vincenzo et al.

(10) Patent No.: US 7,515,493 B2
(45) Date of Patent: Apr. 7, 2009

(54) SENSING CIRCUIT FOR SEMICONDUCTOR MEMORIES

(76) Inventors: Umberto Di Vincenzo, Via Roma, 40, I-24042 Capriate S. Gervasio (BG) (IT); Roberto Versari, Via Alberto Mario, 22, I-47100 Forli' (IT); Massimiliano Mollichelli, Via Postore, 88, I-20043 Arcore (MI) (IT)

( * ) Notice: Subject to any disclaimer, the term of this patent is extended or adjusted under 35 U.S.C. 154(b) by 0 days.

(21) Appl. No.: 11/739,167

(22) Filed: Apr. 24, 2007

(65) Prior Publication Data

US 2007/0285999 A1      Dec. 13, 2007

(30) Foreign Application Priority Data

May 19, 2006    (EP)    ................................. 06114228

(51) Int. Cl.
*G11C 7/02* (2006.01)
(52) U.S. Cl. ..................... 365/207; 365/203; 365/210.1
(58) Field of Classification Search ............ 365/185.21, 365/207, 202, 203, 205, 210.1, 210.12
See application file for complete search history.

(56) References Cited

U.S. PATENT DOCUMENTS

| 5,282,168 | A | 1/1994 | Takahashi |
| 6,281,713 | B1 | 8/2001 | Kim |
| 6,486,731 | B2 * | 11/2002 | Yamasaki et al. ........... 327/541 |
| 2005/0030809 | A1 | 2/2005 | Vimercati et al. |

OTHER PUBLICATIONS

European Search Report from corresponding European Application No. 06114228, filed May 19, 2006.

* cited by examiner

*Primary Examiner*—Anh Phung
*Assistant Examiner*—Hien N Nguyen
(74) *Attorney, Agent, or Firm*—Blakely, Sokoloff, Taylor & Zafman LLP (57) ABSTRACT

A sensing circuit is provided. The sensing circuit is adapted to determine when a cell current flowing trough a selected memory cell exceeds a reference current during an evaluation phase of a sensing operation. The sensing circuit is adapted to be coupled to at least one selected memory cell through a respective bit line. The sensing circuit includes: an access circuit node adapted to be coupled to the bit line; precharging circuitry adapted to be activated in a precharge phase of the sensing operation preceding the evaluation phase, so as to bring a voltage of said access circuit node to a reference voltage; a reference circuit node coupled to the access circuit node and arranged to receive the reference current. The sensing circuit further includes an evaluation circuit node coupled to the reference circuit node through a first current to voltage converter, adapted to sink a current flowing from the reference circuit node to the evaluation circuit node and to produce a corresponding voltage difference between the reference circuit node and the evaluation circuit node, wherein the current is nearly equal to the reference current substantially at the end of the precharge phase; comparator circuitry is provided, adapted to compare the voltage of the access circuit node with the voltage of the evaluation circuit node and to provide a corresponding comparison signal whose time pattern indicates when the cell current exceeds the reference current. The first current to voltage converter is an electronic device having essentially the behavior of a diode.

10 Claims, 6 Drawing Sheets

SENSING CIRCUIT FOR SEMICONDUCTOR MEMORIES

BACKGROUND OF THE INVENTION

1. Field of the Invention

The present invention generally relates to semiconductor memories, either stand-alone or embedded in more complex integrated circuit electronic systems. In particular, the invention relates to an improved sensing circuit for a semiconductor memory.

2. Discussion of the Related Art

Semiconductor memories are commonly used in several applications for storing information, both temporarily (in so-called volatile memories), and permanently (in so-called non-volatile memories). Non-volatile memories are capable of retaining the stored information even in absence of a power supply source.

Typically, a non-volatile semiconductor memory comprises a matrix of memory cells, e.g., floating gate MOS transistors; each memory cell has a threshold voltage adapted to be programmed to different levels, corresponding to different logic values.

The so-called flash memory is a very popular type of non-volatile memory, which also exhibits the capability of electrically writing and erasing the memory cells.

For example, each memory cell of a two-level flash memory is adapted to store a single information bit. In an erased condition, the generic memory cell has a relatively low threshold voltage (associated by convention with the logic value "1"); the memory cell is programmed by injecting electrons into its floating gate: in this condition the memory cell has a higher threshold voltage (associated by convention with the logic value "0").

Multilevel flash memories comprise memory cells capable of storing more than just one information bit. Each memory cell can be programmed to one of a plurality of different states, each corresponding to a respective range of threshold voltage values. For example, each memory cell of a four-level flash memory stores a logic value consisting of two information bits ("11", "10", "01" e "00", with the logic value "11" that is associated with the lowest threshold voltage range and the logic value "00" that is associated with the highest threshold voltage range).

In order to retrieve the stored information, semiconductor memories comprise reading circuits, adapted to read the data stored in the memory cells.

Particularly, the data stored in the selected memory cell is read by comparing the behavior of the current flowing through the selected memory cell with the behavior of the current(s) provided by one or more reference cells which are programmed to predetermined states. For this purpose, the reading circuit has to properly bias the selected memory cell and the reference cells.

The comparison between the currents flowing through the selected memory cell and the reference memory cells, respectively, is typically performed by sensing circuits, included in the reading circuit and adapted to generate output signals whose value provide an indication of the logic value stored in the selected memory cell.

A known technique for reading the information stored in the memory cells is the so-called ramp-voltage sensing technique.

Essentially, the ramp-voltage sensing technique comprises two different phases: a precharge phase and an evaluation phase. Before the evaluation phase of the datum stored in the selected memory cell, the precharge phase is required for precharging an access line (e.g., a bit line) coupled to the selected memory cell, to a predetermined potential, in such a way as to charge stray capacitances intrinsically associated therewith. In fact, a current flowing through the bit line causes the charging of the associated stray capacitances, and, accordingly, a corresponding transient is required before the bit line voltage and current reach a steady value. Thus, for avoiding a wrong reading performed during this transient, it is necessary to guarantee that the bit line charging is completed, before performing an evaluation on the logic value stored in the memory cell accessed for reading. Regretfully, the length of this transient depends on a number of factors, such as the operating temperature, the value of a supply voltage of the memory device, and statistical variations of parameters whose values are affected by the manufacturing process.

According to the ramp-voltage sensing technique, the evaluation phase provides for applying a voltage ramp to the control gate of a selected memory cell to be read and to the reference memory cells (having known threshold voltages); the datum stored in the selected memory cell is determined on the basis of a time relationship between the instants at which the selected memory cell and the reference memory cells pass from a first conduction state to a second conduction state. In the practice, the first conduction state corresponds to a sunk current less than a predetermined current and the second conduction state corresponds to a sunk current equal to or exceeding the predetermined current. This sensing technique is particularly suited for the sensing of multi-level memory cells.

A known sensing circuit used for performing both the precharge phase and the evaluation phase according to the ramp-voltage sensing technique is described in European patent application EP1505605.

Figure 1:
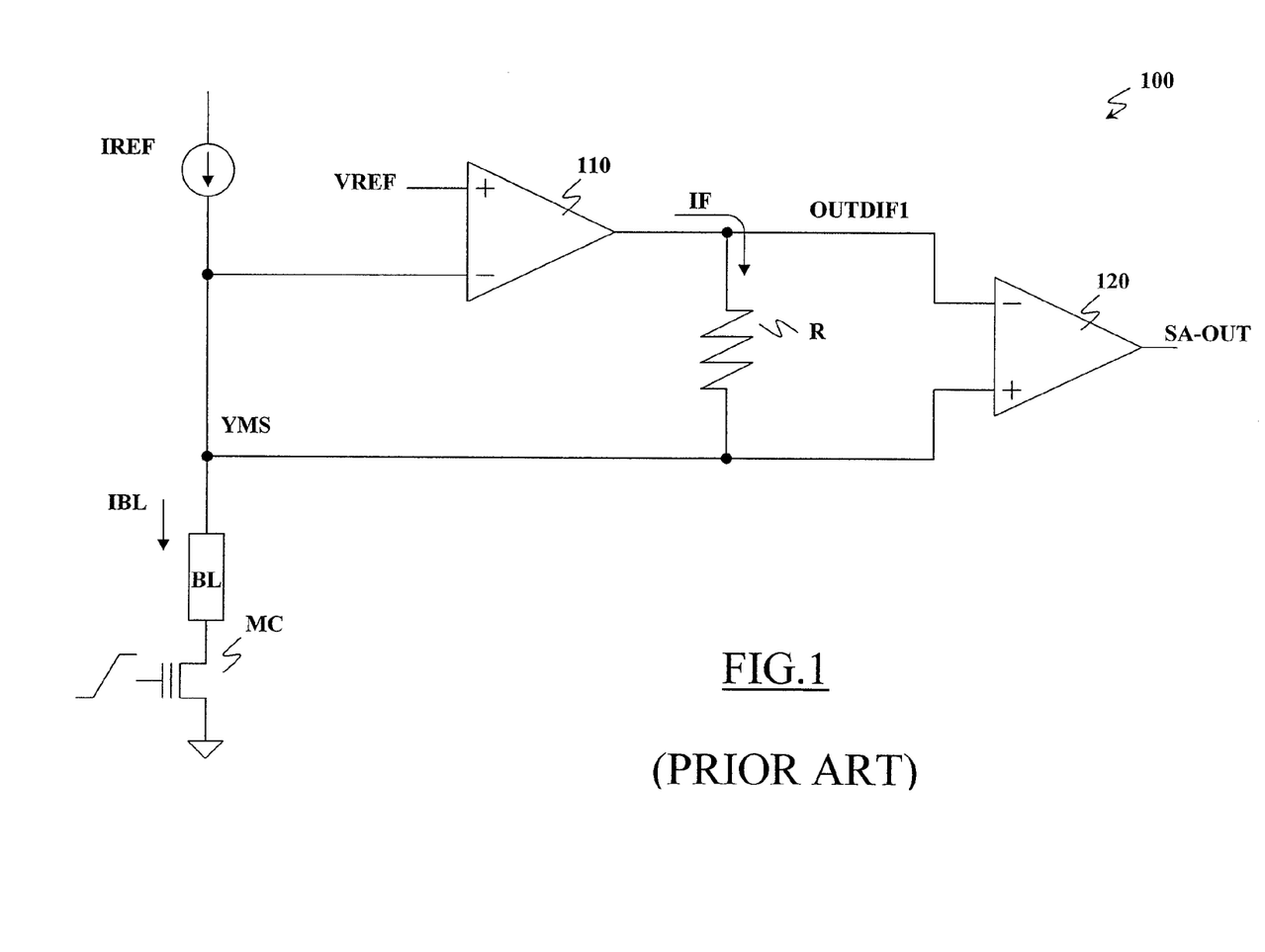
FIG. 1 illustrates a circuit diagram of a known sensing circuit adapted to be used in a ramp-voltage sensing of a memory cell.

FIG. 1 shows an exemplary circuit diagram of a known sensing circuit 100 adapted to perform both the precharge and the evaluation according to the ramp-voltage sensing technique. The sensing circuit 100 comprises an amplifier 110, particularly a differential amplifier of relatively high gain, having an inverting input (indicated by the symbol "−") and a non-inverting input (indicated by the symbol "+"). The inverting input of the amplifier 110 is connected to a circuital node YMS, that is coupled to a selected memory cell MC through a bit line BL. The non-inverting input is instead fed with a reference voltage VREF, having a desired predetermined value which is the target potential of the node YMS. A resistive load element R, typically, a polysilicon resistor, is connected in negative feedback between an output OUTDIF1 of the amplifier 110 and the inverting input thereof. The output OUTDIF1 of the amplifier 110 is also fed to an inverting input of a comparator 120, having a non-inverting input directly connected to the inverting input of the amplifier 110, and thus to the node YMS. An output of the comparator 120 forms an output SA-OUT of the sensing circuit 100. The node YMS is also connected to a reference current generator, providing a reference current IREF to be exploited during the evaluation phase.

Figure 2:
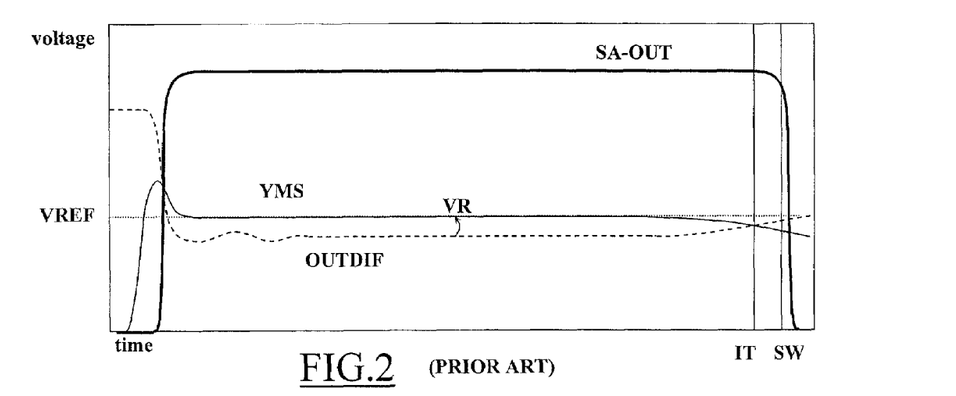
FIG. 2 illustrates the evolution in time of the potentials of some circuit nodes of the sensing circuit of FIG. 1.

FIG. 2 pictorially illustrates the evolution in time of the potentials of the node YMS, the output OUTDIF1 and the output SA-OUT during both the precharge and evaluation phases.

At the beginning of the precharge phase, the capacitance (not shown in the Figure) intrinsically associated with the bit line BL (and thus loading the node YMS) is assumed to be discharged, so the potential of the node YMS is low, approximately equal to a reference (ground) voltage GND. Since the voltage difference between the non-inverting input and the inverting input of the amplifier 110 is positive (it is assumed that the reference voltage VREF is higher than the ground voltage GND), the potential of the output OUTDIF1 assumes a high positive value. Consequently, the amplifier 110 delivers a feedback current IF of relatively high intensity, flowing from the output OUTDIF1 to the node YMS through the resistor R. Also, the reference current IREF flows to the node YMS. In this way, the capacitance of the node YMS is charged, and the potential of the node YMS increases. As long as the potential of the node YMS is lower than the reference voltage VREF, the potential of the output OUTDIF1 is positive. Also, as long as the potential of the output OUTDIF1 is higher than the potential of the node YMS, the feedback current IF flows from the output OUTDIF1 to the node YMS, and the voltage difference between the non-inverting input and the inverting input of the comparator 120 is negative. Consequently, during this period of time, the potential of the output SA-OUT of the comparator 120 is low, for example at a value equal to the ground voltage GND. As the potential of the node YMS increases, the (absolute value of the) potential of the output OUTDIF1 and the (absolute value of the) feedback current IF decrease.

At the end of the precharge phase, the potential of the node YMS reaches the reference voltage VREF, and the feedback current IF starts flowing in the reverse direction, flowing from the node YMS to the output OUTDIF1. In this way, the voltage difference between the node YMS and the output OUTDIF1 is positive and the potential of the output SA-OUT of the comparator 120 switches high, since the potential of its non-inverting terminal becomes higher than the potential of its inverting terminal. Moreover, after a transient, the feedback current IF equals the reference current IREF, and the potential of the node YMS is stable. In this steady-state condition, the voltage difference VR between the node YMS and the output OUTDIF1 is stable, with the node YMS at a potential higher than that of the output OUTDIF1.

Once the precharge phase is terminated, the evaluation phase is started by applying a voltage ramp to the control gate of the selected memory cell MC to be read and to the reference cells. When the voltage ramp reaches a sufficiently high value, the selected memory cell MC begins draining a current IBL from the node YMS, through the bit line BL. The feedback current IF still flows from the node YMS to the output OUTDIF1 but, since the reference current IREF is constant, as the current IBL increases, the (absolute value of the) feedback current IF decreases.

When, due to the increase in the gate voltage, the current IBL reaches and exceeds the reference current IREF, the feedback current IF reverses its direction, flowing from the output OUTDIF1 to the node YMS and this in turn causes the reverse in the sign of the voltage difference VR across the resistor R. In fact, the potential of the output OUTDIF1 exceeds the potential of the node YMS at an inversion time IT, as depicted in FIG. 2. In this way, the potential of the output SA-OUT of the comparator 120 switches again low (e.g., to the ground voltage GND) at a switching instant SW right after the inversion time IT. The delay between the inversion time IT and the switching instant SW depends on the switching speed of the comparator 120.

The switching instant SW of the comparator 120 is then exploited for retrieving the datum stored into the selected memory cell MC: the higher the threshold voltage of the selected memory cell MC, the later the switching instant SW occurs. More in particular, the switching instant SW in respect of the selected cell to be read is compared to a switching instant SWREF for a reference memory cell having a known predetermined threshold voltage, determined using a sensing circuit identical to the circuit 100. If the switching instant SW occurs before the switching instant SWREF, the threshold voltage of the selected memory cell MC is lower than the threshold voltage of the reference memory cell, and vice versa.

The Applicant has observed that the known sensing circuit 100 for the ramp-voltage sensing technique described in the foregoing is affected by some problems.

First of all, the sensing circuit 100 is very sensitive to variations of the reference current IREF and to disturbs affecting the reference voltage VREF, the potential of the node YMS and the potential of the output OUTDIF1. Since the inversion time IT (and the switching instant SW of the comparator 120) strongly depends on the voltage difference VR at the end of the precharge phase, the lower the intensity of the reference current IREF, the higher the sensitivity to the disturbs of the sensing circuit 100, because the voltage difference VR between the node YMS and the output OUTDIF1 is made smaller. Variations of the reference current IREF may delay or anticipate the switching instant SW, and consequently increase the uncertainty of the evaluation of the datum stored in the selected memory cell MC.

In order to make the sensing circuit 100 less susceptible to disturbs, it is preferable operating with relatively high voltage differences VR. This means that, with the same reference current IREF, a resistor R having a higher resistance value is needed.

However, in order to integrate a polysilicon resistor R having a relatively high resistance value, a significant area within the semiconductor chip wherein the sensing circuit 100 is integrated is wasted. Furthermore, the resistance values of polysilicon resistors are affected by mismatches, capable in this case of invalidating the evaluation phase and/or increasing the precharge phase duration.

Moreover, by increasing the resistance value of the resistor R too much, the duration of the precharge phase is unfavorably increased, because the intensity of the feedback current IF flowing from the output OUTDIF1 to the node YMS is reduced, and therefore the capacitance of the node YMS takes more time for being charged.

Also, observing again FIG. 2, it can be appreciated that the voltage difference VR between the node YMS and the output OUTDIF1 becomes smaller and smaller (in absolute value) during the final part of the evaluation phase. Consequently, even if a resistor R having a high resistance value is used (so as to obtain an increased voltage difference VR at the end of the precharge phase), a disturb occurring in the final part of the evaluation phase would significantly shift the inversion time IT.

In view of the state of the art outlined in the foregoing, it is an object of the present invention to provide an improved sensing circuit which were not affected by the problems of the known sensing circuits, in particular by the problems discussed above.

SUMMARY OF THE INVENTION

A sensing circuit is adapted to determine when a cell current flowing trough a selected memory cell exceeds a reference current during an evaluation phase of a sensing operation. The sensing circuit is adapted to be coupled to at least one selected memory cell through a respective bit line. The sensing circuit includes: an access circuit node adapted to be coupled to the bit line; precharging means adapted to be activated in a precharge phase of the sensing operation preceding the evaluation phase, so as to bring a voltage of said access circuit node to a reference voltage; a reference circuit node coupled to the access circuit node and arranged to receive the reference current. The sensing circuit further includes an evaluation circuit node coupled to the reference circuit node through a first current to voltage converter, adapted to sink a current flowing from the reference circuit node to the evaluation circuit node and to produce a corresponding voltage difference between the reference circuit node and the evaluation circuit node, wherein said current is nearly equal to the reference current substantially at the end of the precharge phase; comparator means are provided, adapted to compare the voltage of the access circuit node with the voltage of the evaluation circuit node and to provide a corresponding comparison signal whose time pattern indicates when the cell current exceeds the reference current. The first current to voltage converter is an electronic device having essentially the behavior of a diode.

BRIEF DESCRIPTION OF THE DRAWINGS

The features and advantages of the invention will be best understood by reading the following detailed description of an exemplary, non-limitative embodiment thereof, to be read in conjunction with the accompanying drawings.

DETAILED DESCRIPTION

Figures 3, 4:
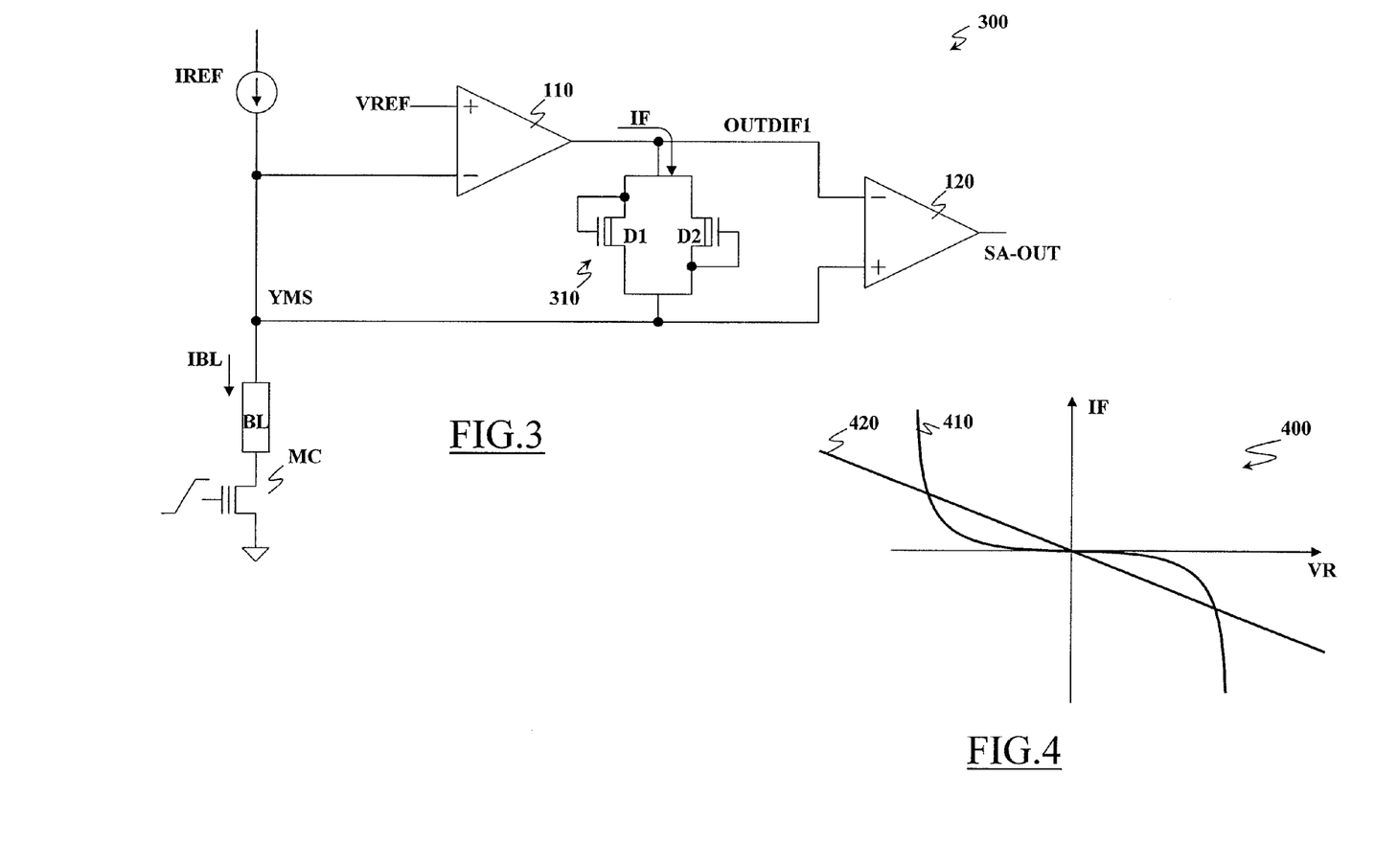
FIG. 3 illustrates a circuit diagram of a sensing circuit according to a first embodiment of the present invention.
FIG. 4 shows by way of comparison current/voltage characteristics of a current/voltage converter included in the sensing circuit of FIG. 3 and of a resistor.

Referring to the drawings, FIG. 3 illustrates the circuit diagram of a sensing circuit 300 according to a first embodiment of the present invention (the elements corresponding to those shown in FIG. 1 are denoted with the same reference numerals, and their explanation is omitted for the sake of brevity). The sensing circuit 300 has essentially the same structure of the sensing circuit 100, except for the fact that the resistor R of the circuit 100 is replaced by a current/voltage converter 310 which includes two elements behaving essentially like diodes, particularly two diode-connected NMOS transistors D1, D2, connected in parallel but in reverse direction. More particularly, the transistor D1 has a drain terminal connected to the output OUTDIF1 of the amplifier 110, a source terminal connected to the node YMS and a gate terminal connected to the drain terminal; the transistor D2 has a source terminal connected to the output OUTDIF1, a drain terminal connected to the node YMS and a gate terminal connected to the drain terminal. Preferably, both the transistor D1 and the transistor D2 are "native" transistors, i.e., they have relatively low threshold voltages, their channel regions being realized without the performance of an ion implantation or diffusion for adjusting the threshold voltage.

It is pointed out that nothing prevents from using PMOS transistors for realizing both the transistor D1 and the transistor D2, even if native PMOS are worse from the matching viewpoint.

The operations performed by the sensing circuit 300 are similar to those previously described for the sensing circuit 100. At the beginning of the precharge phase, when the potential of the node YMS has not yet reached the reference voltage VRIF, the feedback current IF flows from the output OUT-DIF1 of the amplifier 110 to the node YMS through the transistor D1, acting as a forward-biased diode. At the same time, the transistor D2 is off (i.e., it behaves as a reversed-biased diode), because the voltage difference VR between the node YMS and the output OUTDIF1 is negative. At the end of the precharge phase, when the potential of the node YMS reaches and exceeds the reference voltage VREF, the feedback current IF reverses its direction, the transistor D2 turns on, and the transistors D1 turns off, since the voltage difference VR becomes positive. This condition (D2 on, D1 off) still persists during the evaluation phase, till the inversion time IT, when the voltage difference VR assumes again a negative value. More particularly, during the evaluation phase a voltage VRAMP is applied to the gate terminal of the selected memory cell MC. The value of the voltage VRAMP increases according to an increasing voltage ramp. When the voltage VRAMP reaches a sufficiently high value, the selected memory cell MC begins draining a current IBL from the node YMS, through the bit line BL. The value of such current IBL increases in time, as the voltage VRAMP increases. As previously described in respect of the sensing circuit 100, the feedback current IF still flows from the node YMS to the output OUTDIF1 (through the transistor D2) but, since the reference current IREF is constant, as the current IBL increases, the (absolute value of the) feedback current IF decreases. When the current IBL reaches the value of the reference current IREF, the feedback current IF reverses its direction, so as to respect the Kirchoffs current law at the node YMS. In this way, the transistor D1 turns on and the transistor D2 turns off (inversion time IT), and the potential of the output OUTDIF1 rises over the potential of the node YMS (i.e., the voltage difference VR assumes a negative value). Consequently, the potential of the output SA-OUT switches low (switching instant SW).

The diagram 400 of the FIG. 4 illustrates the current/voltage characteristic 410 of the current/voltage converter 310 compared to the current/voltage characteristic 420 of a resistor (like the resistor R used in the known sense circuit 100 of FIG. 1).

More particularly, the diagram 400 has a first reference axis (abscissa) used for denoting the voltage difference VR across the node YMS (drain terminal of the transistor D2) and the output OUTDIF1 (drain terminal of the transistor D1); a second reference axis (ordinate) is instead used for denoting the feedback current IF (whose value is assumed to be positive when flowing from the output OUTDIF1 to the node YMS). The origin of the system, given by the intersection of the two reference axe, corresponds to the condition experienced at the ideal inversion time IT, when both the voltage difference VR and the feedback current IF are zero.

When the feedback current IF assumes low (both positive and negative) values, the current/voltage converter 310 generates a voltage difference VR which is higher (in absolute value) than the voltage difference generated by the resistor R. Vice versa, when the feedback current IF assumes high (both positive and negative) values, the voltage difference VR is higher (in absolute value) in the case of the resistor R.

Comparing the current/voltage characteristic 410 with the current/voltage characteristic 420 it can be observed that the use of the current/voltage converter 310 provides several advantages with respect to the use of the resistor R.

In fact, thanks to the particular shape of the current/voltage characteristic 410, at the beginning of the precharge phase the feedback current IF flowing from the output OUTDIF1 of the amplifier 110 to the node YMS through the transistor D1 is higher compared with the case with the resistor R; in this way, the charging the capacitance of the node YMS is faster. At the end of the precharge phase, the value of the feedback current IF (flowing from the node YMS to the output OUTDIF1 of the amplifier 110 through the transistor D2) is equal to that of the reference current IREF. This value is relatively small, and the voltage difference VR is higher compared to the case with the resistor R. In this way, the comparator 120 is driven in a more advantageous way by a higher input voltage, as explained in the following.

Figure 5:
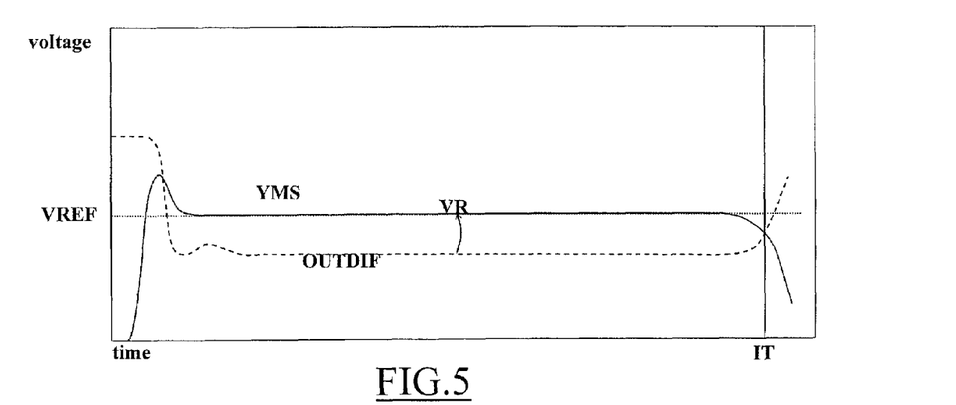
FIG. 5 illustrates the evolution time of the potentials of some circuit nodes of the sense circuit of FIG. 3.

The abovementioned features can be observed referring to FIG. 5, which illustrates the simulated evolutions in time of the potentials of the node YMS and the output OUTDIF1 of the amplifier 110 in the sensing circuit 300 during both the precharge and the evaluation phases. More in particular, it can be seen that the voltage difference VR between the node YMS and the output OUTDIF1 remains higher than in the case illustrated in FIG. 2 for almost all the time.

During the evaluation phase, when the selected memory cell MC begins draining the current IBL, the potential of the node YMS tends to lower. In this way, the transistor D2 starts to turn off, decoupling the output OUTDIF1 from the node YMS, in such a way to speed up the variation of the output OUTDIF1. In fact, the evolution in time of the potential of the output OUTDIF1 in the proximity of the inversion time IT is steeper than in the case illustrated in FIG. 2.

This feature makes the sensing circuit 300 less susceptible to disturbances, and, in particular, less susceptible to spurious and unpredictable variations of the reference current IREF. In fact, a different reference current IREF would vary the potential assumed by the output OUTDIF1 at the end of the precharge phase, varying in turn the inversion time IT and, consequently, the switching instant SW, possibly invalidating the reading of the datum stored in the memory cell. However, with the sensing circuit of FIG. 3, thanks to the steep time trend of the potential of the output OUTDIF1, said variation of the inversion time IT is greatly reduced.

This can be explained referring back to the diagram 400 of FIG. 4. The spurious variations of the reference current IREF cause the current/voltage characteristics 410 and 420 to shift along the direction of the first reference axis, provoking in turn an undesired alteration of the current/voltage conditions that determines the inversion time IT. In other words, the inversion time IT would correspond to a non-zero feedback current IF. In the case of the sensing circuit 100, since the current/voltage characteristic 420 of the resistor R has a linear trend, a shift thereof along the direction of the first reference axis would strongly alter the current/voltage conditions that determines the inversion time. On the contrary, in the case of the sensing circuit 300, in correspondence of feedback currents IF having low values (i.e., during the evaluation phase, in the proximity of the inversion time IT), the current/voltage characteristic 410 is rather a "flat" trend, and this makes the voltage difference VR more stable with respect the current variations due to disturbs, because the effects provoked by shifting the current/voltage characteristic 410 along the direction of the first reference axis are strongly reduced.

Another advantage provided by the current/voltage converter 310 is the possibility of reducing the occupation area within the semiconductor chip wherein the sensing circuit 300 is integrated. In fact, the two transistors D1 and D2 of the voltage/converter 310 occupy a silicon area that is about one third the area occupied by a polysilicon resistor.

Moreover, the behavior of the current/voltage converter 310 can be easily trimmed in such a way as to operate during the precharge phase in a different manner with respect to the evaluation phase. More particularly, since the current/voltage converter 310 is formed by a first diode-connected transistors D1 which is mainly employed during the precharge phase, and a second diode-connected transistor D2 which is mainly employed during the evaluation phase, changing the aspect ratio of one of the two transistors D1, D2 with respect to the other allows to increase/decrease (for the same voltage difference VR) the intensity of the feedback current IF during either the precharge or evaluation phases.

Using diode-connected transistors for realizing the current/voltage converter 310 allows configuring, in a simple, way the reference current IREF of the sensing circuit 300. In fact, while the intensity of the reference current IREF in the sensing circuit 100 has to be sufficiently high, so that the voltage difference VR across the terminals of the resistor R is high enough for being able to drive the comparator 120 even in presence of disturbs, the voltage difference VR between the terminals of the current/voltage converter 310 of the sensing circuit 300 is relatively high even for low reference current IREF intensities, thanks to the peculiar shape of the current/voltage characteristic 410. This allows adjustment of the intensity of the reference current IREF in a simple way.

Figure 6:
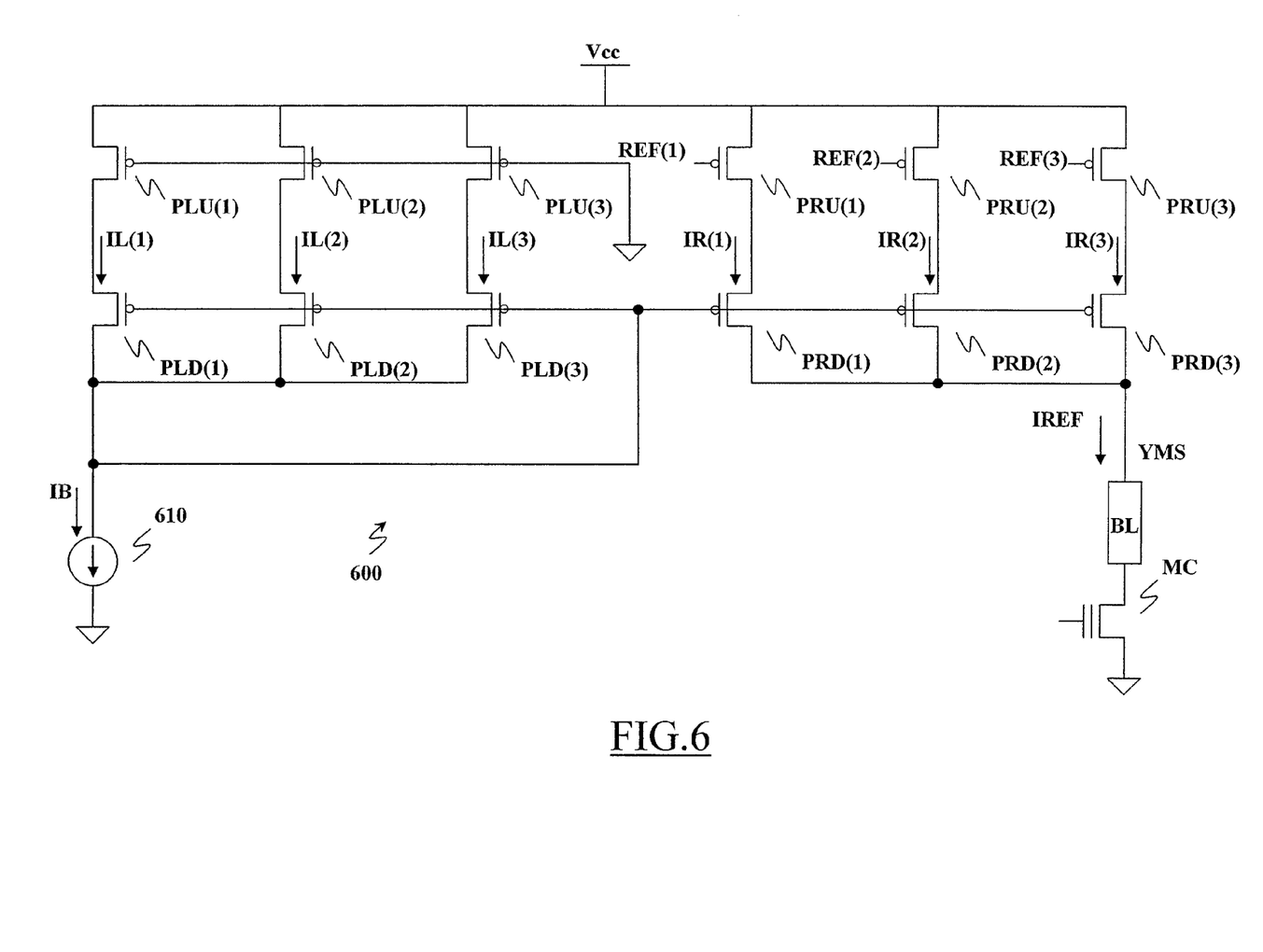
FIG. 6 illustrates a circuit diagram of a reference current generator suitable to be employed in the sensing circuit of FIG. 3.

For example, FIG. 6 illustrates an exemplary circuit diagram of a reference current generator 600 capable of generating a reference current IREF having a trimmable intensity. More particularly, the reference current generator 600 allows trimming the intensity of the reference current IREF by selecting it among three predetermined values (the number of discrete values is not per-se limitative).

For this purpose, the reference current generator 600 includes a base current generator 610 providing a base current IB having a relatively constant value. The base current IB is then provided to a current mirror structure including three current mirrors connected in parallel, each one formed by four PMOS transistors PLD(i), PLU(i), PRD(i) and PRU(i), (i=1 to 3).

More particularly, each transistor PLD(i) has a drain terminal connected to a first terminal of the base current generator 610, a source terminal connected to the drain terminal of the transistor PLU(i) and a gate terminal connected to the first terminal of the base current generator 610. Each transistor PLU(i) has a source terminal receiving a supply reference voltage Vcc and a gate terminal connected to a terminal providing the ground voltage GND. Moreover, each transistor PRD(i) has a drain terminal connected to the node YMS of the sensing circuit 300, a source terminal connected to a drain terminal of the transistor PRU(i) and a gate terminal connected to the gate terminal of the transistor PLD(i). The transistor PRU(i) has a source terminal receiving the supply reference voltage Vcc and a gate terminal receiving a corresponding enabling voltage signal EN(i), capable of selectively assuming the ground voltage GND or the supply reference voltage Vcc.

All the transistors PLD(i) and PRD(i) are assumed to be equal (i.e., they have the same aspect ratio); moreover, all the transistors PLU(i) and PRU(i) have the same aspect ratio (in particular, the transistors PLU(i) and PRU(i) may have the minimal channel length allowed by the manufacturing process used for integrating the sensing circuit). In this way, each circuit branch formed by the transistors PLU(i), PLD(i) is run through by a current IL(i) equal to one third of the base current IB.

Each circuit branch formed by the transistors PRU(i) and PRD(i) can be activated or deactivated depending on the voltage assumed by the corresponding enabling voltage signal EN(i). If the enabling voltage signal EN(i) is low (at the ground voltage GND), the branch formed by the transistors PRU(i) and PRD(i) is activated, and the transistors are crossed by a mirrored replica IR(i) of the current IL(i). If instead the enabling voltage signal EN(i) is high (at the supply reference voltage Vcc), the transistor PRU(i) is off, and the current IR(i) is equal to zero.

Since each branch formed by the transistors PRU(i) and PRD(i) is connected to the node YMS, the reference current IREF is equal to the sum of the currents IR(1), IR(2) and IR(3), and its intensity depends on configuration of the enabling voltage signals EN(i). Consequently, the reference current IREF may be set to be equal to IB/3 (only one branch is enabled), 2*IB/3 (two branch enabled) or to IB (all the three branches are enabled).

Although using the current/voltage converter 310 the charging of the capacitance of the node YMS is speeded up, since the feedback current IF flowing through the transistor D1 is higher than in the case of use of the resistor R, the precharge phase still results intrinsically rather slow. In fact, at the beginning of the precharge phase the potential of the output OUTDIF1 of the amplifier 110 is higher than that of the node YMS. In this phase the potential of the node YMS has to reach the reference voltage VREF; for this purpose the amplifier 110 delivers the feedback current IF for charging the capacitance of the node YMS (said capacitance has a relatively high value, since it comprises the capacitances of the bit line BL connected thereto). The node YMS is charged in a time depending on the value of the capacitance connected thereto and the resistance value of the current/voltage converter 310. The higher the (absolute value of the) feedback current IF, the faster the precharge phase. However, the feedback current IF intensity is limited by the maximum output current that the amplifier 110 is capable of delivering, i.e., by its output saturation current.

Figure 7:
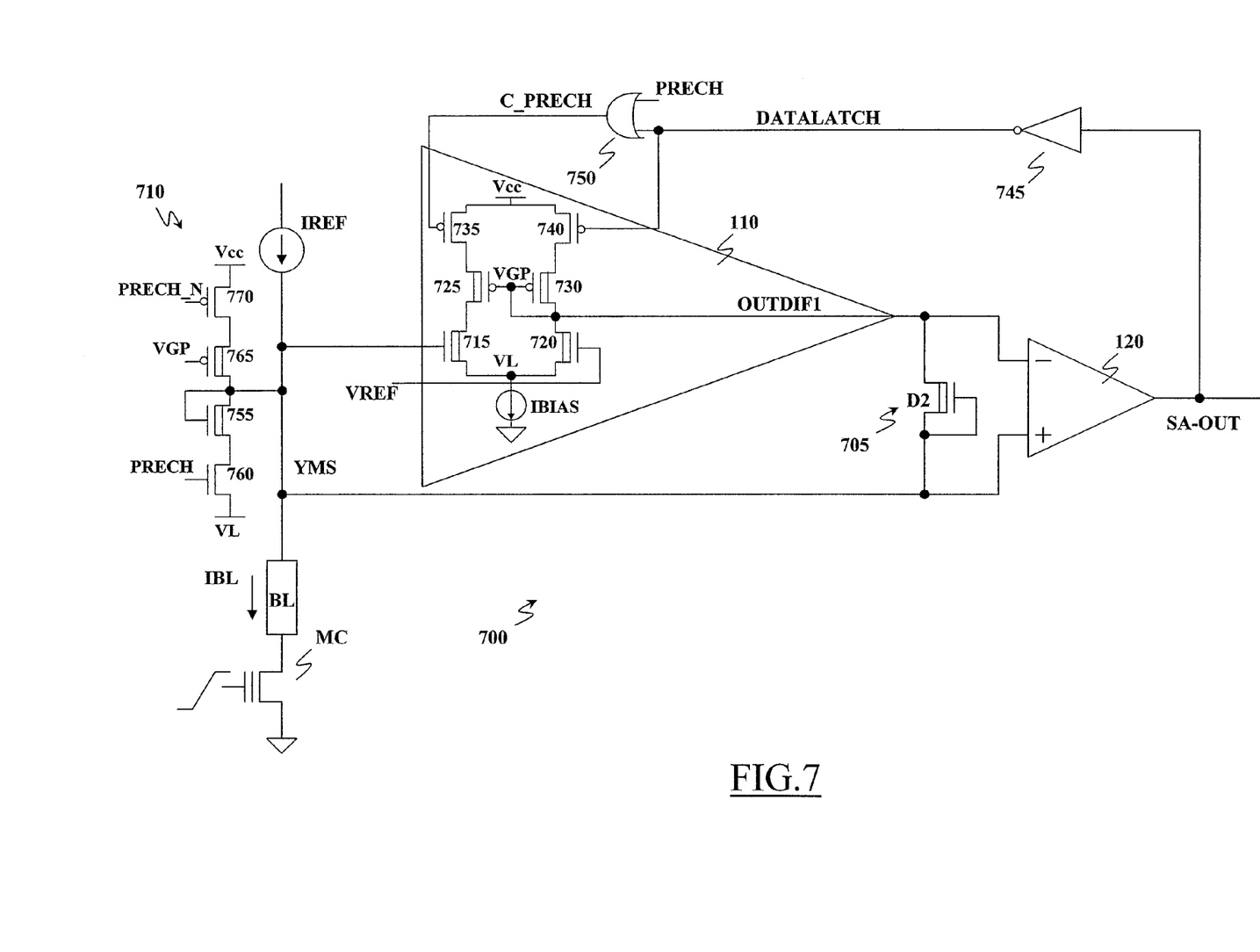
FIG. 7 illustrates a circuit diagram of a sensing circuit according to a second embodiment of the present invention.

In order to overcome the abovementioned limitation, FIG. 7 illustrates a circuit diagram of a sensing circuit 700 according to a second embodiment of the present invention (the elements corresponding to those shown in FIGS. 1 and 3 are denoted with the same reference numerals). According to this embodiment, in which instead of the current/voltage 310 of FIG. 3 a current/voltage converter 705 including only the transistor D2 is used, the precharge phase is not accomplished by exploiting the feedback current IF delivered by the amplifier 110 through the transistor D1 (that in this case is absent), but an auxiliary circuital branch (indicated with 710 in the FIG. 7) is provided to this purpose, as explained in the following.

FIG. 7 illustrates the internal structure of the amplifier 110 in greater detail, showing its circuit diagram; the amplifier 100 is a differential amplifier with an active load formed by a current mirror. More in particular, the amplifier 110 includes an input differential pair formed by two (preferably native) NMOS transistors 715, 720 supplied by a biasing current generator IBIAS: the transistors 715, 720 have source terminals connected to a terminal of the biasing current generator IBIAS, forming a circuital node VL, and drain terminals connected to a PMOS current mirror formed by two (preferably native) PMOS transistors 725, 730. The transistor 715 has a gate terminal connected to the node YMS and the transistor 720 has a gate terminal receiving the reference voltage VREF. The transistor 725 has a drain terminal connected to the drain terminal of the transistor 715, a gate terminal connected to a gate terminal of the transistor 730, forming a circuital node VGP, and a source terminal connected to a drain terminal of a PMOS transistor 735. The transistor 730 has a drain terminal connected to the drain terminal of the transistor 720, a gate terminal connected to the drain terminal and a source terminal connected to a drain terminal of a PMOS transistor 740. The transistors 735, 740 have source terminals receiving the supply reference voltage Vcc. While the transistors 725, 730, connected in such a way to form a current mirror, have the function of forming the active load of the amplifier 100, the transistors 735 and 740 have the function of activating/deactivating the current flow through the transistors of the current mirror. For this purpose, the transistor 735 has a gate terminal receiving a signal C_PRECH, and the transistor 740 has a gate terminal receiving a latching signal DATALATCH indicative of the completion of the evaluation phase.

The latching signal DATALATCH is provided by an output terminal of an inverter logic gate 745, having an input terminal connected to the output terminal SA-OUT of the comparator 120. Moreover, the signal C_PRECH is provided by an output terminal of an OR logic gate 750, having an input terminal receiving the latching signal DATALATCH and a precharge signal PRECH, whose value indicates if the sensing circuit 700 is in the precharge phase or not.

As already mentioned, a current/voltage converter 705 includes only one diode-connected transistor (the transistor D2), in such a way that the feedback current IF can flow only from the node YMS to the output OUTDIF1 of the amplifier 110 (through the transistor D2), and not in the opposite direction.

The auxiliary circuit branch 710 includes a diode-connected, preferably native, NMOS transistor 755 having a source terminal connected to a drain terminal of an NMOS transistor 760 and a drain and a gate terminals connected to the node YMS. The transistor 760 has a source terminal connected to the node VL of the amplifier 110 and a gate terminal receiving the precharge signal PRECH. The auxiliary circuit branch 710 further includes a preferably native PMOS transistor 765 having a drain terminal connected to the node YMS, a gate terminal connected to the node VGP of the amplifier 110 and a source terminal connected to the drain terminal of a PMOS transistor 770. The transistor 770 has a gate terminal receiving a signal PRECH_N which is the logical complement of the precharge signal PRECH, and a source terminal receiving the supply reference voltage Vcc. The PMOS transistors 765, 770 of the auxiliary circuit branch 710 are dimensioned in such a way to have higher transconductances compared to the NMOS transistors 755, 760. In this way, when the auxiliary branch is fully operative, i.e., during the precharge phase, when all the transistors 755, 760, 765 and 770 are on, the current flowing from the terminal providing the supply reference voltage Vcc to the node YMS through the transistors 765, 770 is higher than the current flowing from the node YMS to the terminal providing the ground voltage GND through the transistors 755, 760.

Figure 8:
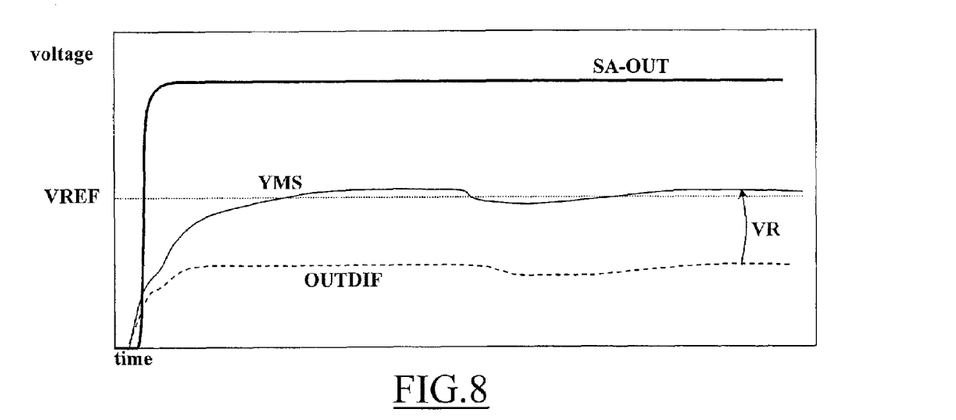
FIG. 8 illustrates the evolution in time of the potentials of some circuit nodes of the sense circuit of FIG. 7.

In order to explain how the sensing circuit 700 operates during the precharge phase, reference will be now jointly made to FIG. 7 and to FIG. 8, the latter figure illustrating the evolution in time of the potentials of the node YMS, of the output OUTDIF1 of the amplifier 110 and of the output SA-OUT of the sensing circuit 700 during the precharge phase.

At the beginning of the precharge phase, when the potential of the node YMS is at the ground voltage GND, the precharge signal PRECH is set to a high voltage value, for example equal to the supply reference voltage Vcc. In this way, the signal C_PRECH is driven to a high value too, and the transistor 735 of the amplifier 110 is turned off, so that the left circuit branch of the amplifier formed by the transistors 715, 725 and 735 is not crossed by any current. Therefore, all the current sunk by the biasing current generator IBIAS runs through the right circuit branch of the amplifier 110 (i.e., through the transistors 720 and 730). As a consequence, the transistor 730, in order to be crossed by said current, causes its gate terminal (connected to the node VGP) to assume a low voltage value. Since the node VGP is connected to the gate terminal of the transistor 765, the latter transistor turns on, and a mirrored replica Ip of the current sunk by the transistor 730 starts flowing from the terminal providing the supply reference voltage Vcc to the node YMS through the transistors 765 and 770 (the signal PRECH_N is at the ground voltage GND). In other words, the left circuit branch of the amplifier 110 is replaced by the auxiliary branch 710 during the precharge phase, so as the capacitance of the node YMS is charged by the current Ip. Since at the beginning of the precharge phase the potential of the node YMS is at the ground voltage GND, the transistor 755 is off, and does not conduct any current. As the potential of the node YMS increases thanks to the current Ip that charges the parasitic capacitance, the transistors 755 starts turning on, sinking a current In from the node YMS to the node VL. According to the Kirchoff's current law at the node YMS, the current balance is: IF+In=IREF+Ip, wherein the direction of the feedback current IF is assumed to be from the node YMS to the output OUTDIF1. However, thanks to the particular dimensioning of the transistors of the auxiliary circuit branch 710, and thanks to the values assumed by the potential of the node YMS, the current Ip is higher (in absolute value) than the current In, in such a way that the intensity of the feedback current IF, flowing through the transistor D2 and the transistor 720, is positive. In this way, the voltage difference VR between the node YMS and the output OUTDIF1 of the amplifier 110 becomes quickly positive, sooner than in the previous cases, and the potential of the output SA-OUT of the comparator 120 switches high already at the beginning of the precharge phase.

Since the potential of the output SA-OUT is at the high value, the latching signal DATALATCH switches low to the ground voltage GND, turning the transistor 740 on. Thus, during all the precharge phase, the potential of the node YMS increases until it reaches the reference voltage VREF, and remains always higher than the potential of the output OUTDIF1.

At the end of the precharge phase, the precharge signal PRECH is switched low to the ground voltage GND, turning off the auxiliary branch 710 and activating the left circuit branch of the amplifier 110. Consequently, the transistors 715, 725 and 735 turn on, sinking a mirrored replica of the current sunk by the transistor 730. In this way, the amplifier 110 is in an operative condition adapted to carry out the evaluation phase (that is not described, being the evaluation phase equal to that previously described referring to the sensing circuit 300). When the precharge signal PRECH switches, the potential of the node VL, and consequently of the node VGP, slightly increases in value for a transient, since the transistor 715 starts providing current thereto. However, the transistors 755 and 765 are dimensioned in such a way that the current flowing there through barely before the switching of the precharge signal PRECH is equal (or, at least, almost equal) to the current sunk by the transistors 715 and 725.

It has to be underlined that during said transient the evaluation phase can be expediently initiated applying the voltage VRAMP to the control gate of the selected memory cell MC (thus reducing the duration of the precharge phase), taking advantage of the non-conductivity of the memory cell MC as long as the value reached by the voltage VRAMP is lower than the threshold voltage of the memory cell MC.

The sensing circuit 700 has two main advantages.

The node YMS is charged directly by the auxiliary circuit branch 710 with a constant current, without the need of being charged by the feedback current IF through the current/voltage converter 705. In this way, the time constant characterizing the charging process of the node YMS, that in the sensing circuit 300 is given by the capacitance of the node YMS multiplied by the resistance of the current/voltage converter, is definitely reduced.

Moreover, the output SA-OUT of the comparator 120 switches high before the potential of the node YMS has reached the reference voltage VREF. In this way, the precharge time is only limited by the time needed for bringing the potential of the node YMS to the reference voltage VREF, and not by the switching time of the output SA-OUT.

It has to be observed that both the sensing circuit 300 and the sensing circuit 700 have several advantages with respect the known sensing circuit 100 with the current/voltage converter including a resistor R. In fact, both the sensing circuit 300 and the sensing circuit 700 are substantially less susceptible to disturbs, and they are less prone to reading errors in the evaluation phase, thanks to the particular non-linear diode-like current/voltage characteristic with respect to the linear current/voltage characteristic of the resistor. Additionally, the sensing circuit 700 is particularly designed in such a way to speed up the precharge phase, thanks to the presence of an auxiliary circuit branch having the purpose of charging the node YMS.

However, regarding the evaluation phase, both the sensing circuits 300 and 700 may result a little slower than the known sensing circuit 100, i.e., their switching instant SW occurs slightly later with respect the switching instant SW of the sensing circuit 100.

This occurs for two main reasons.

Firstly, the current IBL drained by the memory cell MC during the evaluation phase is slightly higher in the case of the sensing circuit 100 with the resistor R, since the discharge of the bit line capacitance is slower in the cases with diode-connected transistors (sensing circuits 300 and 700). In fact, in the sensing circuit 100, once the current IBL has exceeded the reference current IREF, the voltage difference VR across the resistor R changes sign, and the feedback current IF starts to flow through the bit line BL. This does not occur in the sensing circuit 300, since the comparator 120 switches before the transistor D1 is activated (because of its threshold voltage).

The second reason is the higher voltage difference VR between the node YMS and the output OUTDIF1 of the amplifier 110 at the end of the precharge phase in the sensing circuits 300 and 700. In fact, even though the evolution in time of the potential of the output OUTDIF1 of the amplifier 110 is steeper in the sensing circuits 300 and 700 (as shown in FIG. 5), the inversion time IT occurs before in the sensing circuit 100.

Practically, the same reasons that make the sensing circuits 300, 700 less susceptible to the disturbs may render the sensing circuits 300, 700 slightly slower (considering reference currents IREF of the same intensities) with respect to the sensing circuit 100.

Figure 9:
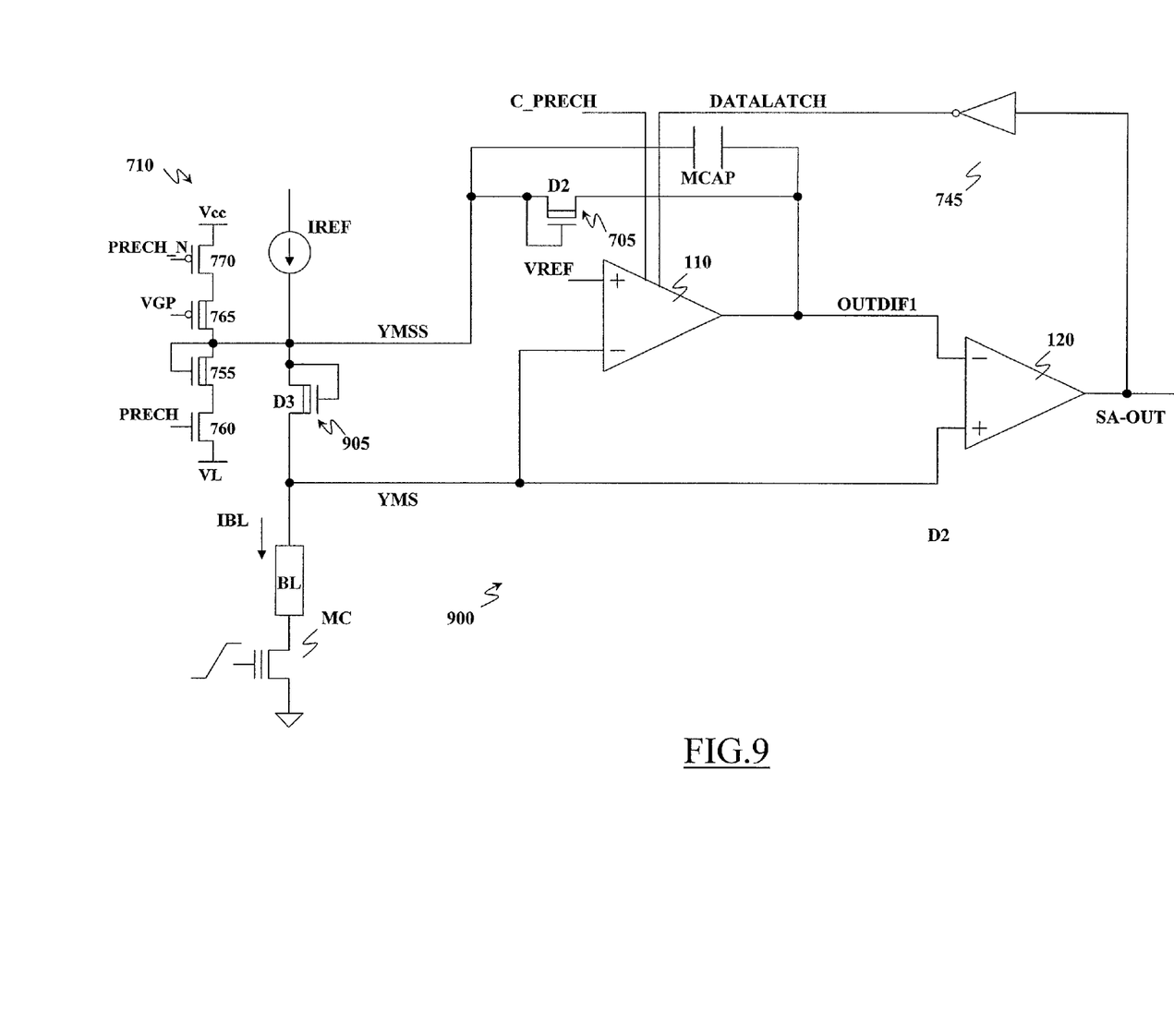
FIG. 9 illustrates a circuit diagram of a sensing circuit according to a third embodiment of the present invention.

In order to speed up the evaluation phase maintaining at the same time the beneficial features of the sensing circuits 300 and 700, according to a further embodiment a modified version of the sensing circuit 700 is provided, including an additional current/voltage converter, as depicted in FIG. 9.

More particularly, FIG. 9 illustrates a sensing circuit 900 having a circuit structure similar to that of the sensing circuit 700 of FIG. 7, with the addition of a further current/voltage converter 905 connected between the node YMS (coupling the bit line BL with the non-inverting input of the comparator 120 and the inverting input of the amplifier 110) and a node YMSS formed by the connection of the drain terminal of the transistor D2 with the current generator providing the reference current IREF and the auxiliary circuital branch 710. The current/voltage converter 905 includes a diode-connected NMOS transistors D3, having a drain terminal connected to the node YMSS, a source terminal connected to the node YMS and a gate terminal connected to the drain terminal. The transistor D3 is of the native type and has the same aspect ratio of the transistor D2.

With such additional current/voltage converter 905, considering same reference currents IREF, the switching instant SW of the sensing circuit 900 occurs before than in the case of the sensing circuits 300 and 700. This can be appreciated analyzing the behavior of the sensing circuit 900 during the evaluation phase.

At the end of the precharge phase, the potential of the node YMSS is almost equal to the potential of the node YMS, because the transistor D3 is almost turned off, and the voltage difference VC among the node YMSS and the node YMS is nearly zero.

During the evaluation phase, when the memory cell MC begins draining the current IBL, the potential of the node YMS decreases, but very slowly. This happens because the node YMS exhibits a heavy capacitive load, given by the stray capacitance associated with the bit line BL to which it is connected. Since the current IBL has to flow through the transistor D3, the transistor D3 is activated, generating a positive voltage difference VC across its terminals. Consequently, since the potential of the node YMS is almost clamped because of its heavy capacitive load, the potential of the node YMSS increases in a very fast way, accordingly increasing the potential of the output OUTDIF1 of the amplifier 110 in such a way to strongly speed the evaluation phase up.

The inversion time IT occurs when the voltage difference VR among the output OUTDIF1 of the amplifier 110 and the node YMS equals zero. Since the voltage difference VR is equal to the voltage difference VC among the node YMSS and the node YMS minus a voltage difference VR' between the drain terminal of the transistor D2 and its source terminal, the inversion time IT occurs when the voltage difference VC reaches the voltage difference VR'.

In order to make the voltage difference VR' between the drain terminal of the transistor D2 and its source terminal less susceptible to disturbs, a capacitor MCAP having a first terminal connected to the node YMSS and a second terminal connected to the output OUTDIF1 of the amplifier 110 is provided. The capacitor MCAP may be for example implemented exploiting the gate capacitance of a native NMOS transistor.

The sensing circuit 900 has the further advantage of being less susceptible to common-mode disturbs that may occurs at the input of the comparator 120. In fact, thanks to the presence of the transistor D3, a fraction of the unavoidable disturbs affecting the potential of the output OUTDIF1 of the amplifier 110 are provided also to the node YMS.

It is pointed out that, even in this case, nothing prevents from using PMOS transistors for realizing both the transistor D2 and the transistor D3, even if native PMOS are worse from the matching viewpoint.

Moreover, the concept of the present invention are also applicable if an amplifier 110 having a different circuit structure is used and/or when the auxiliary circuit branch 710 is differently implemented.

It is also pointed out that although in the foregoing it has always been assumed that diode-connected MOS transistors are used, this is not to be considered a limitation: other ways exists of providing elements behaving essentially like diodes, e.g., pn junction diodes, schocttky diodes etc.

Naturally, in order to satisfy local and specific requirements, a person skilled in the art may apply to the solution described above many modifications and alterations. Particularly, although the present invention has been described with a certain degree of particularity with reference to preferred embodiment(s) thereof, it should be understood that various omissions, substitutions and changes in the form and details as well as other embodiments are possible; moreover, it is expressly intended that specific elements and/or method steps described in connection with any disclosed embodiment of the invention may be incorporated in any other embodiment as a general matter of design choice.

Having thus described at least one illustrative embodiment of the invention, various alterations, modifications, and improvements will readily occur to those skilled in the art. Such alterations, modifications, and improvements are intended to be within the scope of the invention. Accordingly, the foregoing description is by way of example only and is not intended as limiting. The invention is limited only as defined in the following claims and the equivalents thereto.

What is claimed is:

1. A sensing circuit for sensing semiconductor memory cells adapted to determine when a cell current flowing through a selected memory cell exceeds a reference current during an evaluation phase of a sensing operation, the sensing circuit being adapted to be coupled to at least one selected memory cell through a respective bit line and including:
   an access circuit node adapted to be coupled to the bit line;
   precharging means adapted to be activated in a precharge phase of the sensing operation preceding the evaluation phase, so as to bring a voltage of said access circuit node to a reference voltage;
   a reference circuit node coupled to the access circuit node and arranged to receive the reference current;
   an evaluation circuit node coupled to the reference circuit node through a first current to voltage converter, adapted to sink a current flowing from the reference circuit node to the evaluation circuit node and to produce a corresponding voltage difference between the reference circuit node and the evaluation circuit node, wherein said current is nearly equal to the reference current substantially at the end of the precharge phase;
   comparator means adapted to compare the voltage of the access circuit node with the voltage of the evaluation circuit node and to provide a corresponding comparison signal whose time pattern indicates when the cell current exceeds the reference current,
   wherein the first current to voltage converter is an electronic device having essentially the behavior of a diode.

2. The sensing circuit of claim 1, wherein said first current to voltage converter includes a diode-connected transistor having an anode terminal connected to the reference circuit node and a cathode terminal connected to the evaluation circuit node.

3. The sensing circuit of claim 1, further including a negative feedback loop that contains the feedback current and adapted to control the voltage of the access circuit node during the evaluation phase, said negative feedback loop comprising the first current to voltage converter and a differential amplifier having an inverting input connected to the access circuit node, a non-inverting input receiving the reference voltage and an output connected to the evaluation circuit node.

4. The sensing circuit of claim 1, further including a second current to voltage converter connected between the evaluation circuit node and the access circuit node so as to conduct a first charging current flowing from the evaluation circuit node to the access circuit node during the precharge phase and to establish a corresponding voltage difference between the evaluation circuit node and the access circuit node.

5. The sensing circuit of claim 4, wherein said second current to voltage converter includes a diode-connected transistor having an anode terminal connected to the evaluation node and a cathode terminal connected to the access circuit node.

6. The sensing circuit of claim 1, further including an auxiliary circuit branch connected to the reference circuit node adapted to provide a second charging current to the reference circuit node during the precharge phase.

7. The sensing circuit of claim 1, wherein the reference circuit node coincides with the access circuit node.

8. The sensing circuit of claim 6 further including a third current to voltage converter connected between the reference circuit node and the access circuit node.

9. The sensing circuit of claim 8, wherein the third current to voltage converter includes a diode-connected transistor having the anode connected to the reference circuit node and the cathode connected to the access circuit node.

10. A sensing method for sensing threshold voltages of semiconductor memory cells, comprising:
   during a precharge phase, bringing a voltage of an access circuit node coupling the sense circuit to a selected memory cell to a reference voltage;
   during an evaluation phase, determining when a cell current flowing through a selected memory cell exceeds a reference current, said determining including:
   providing the reference current to a reference circuit node coupled to the access circuit node;
   converting a current flowing from the reference circuit node to an evaluation circuit node to a voltage difference between the reference circuit node and the evaluation circuit node, wherein said current is nearly equal to the reference current substantially at the end of the precharge phase;
   comparing the voltage of the access circuit node with the voltage of the evaluation circuit node and providing a corresponding comparison signal whose time pattern indicates when the cell current exceeds the reference current,
   wherein said converting is accomplished by means of an electronic device having essentially the behavior of a diode.

\* \* \* \* \*